United States Patent
Enrici et al.

(10) Patent No.: US 11,973,674 B2
(45) Date of Patent: Apr. 30, 2024

(54) DYNAMIC AND DETERMINISTIC ACCELERATION OF NETWORK SCHEDULING FOR SHARED FPGAS

(71) Applicant: Nokia Solutions and Networks Oy, Espoo (FI)

(72) Inventors: Andrea Enrici, Bourg la Reine (FR); Bogdan Uscumlic, Les Ulis (FR); Julien Lallet, Lannion (FR)

(73) Assignee: Nokia Solutions and Networks Oy, Espoo (FI)

( * ) Notice: Subject to any disclaimer, the term of this patent is extended or adjusted under 35 U.S.C. 154(b) by 134 days.

(21) Appl. No.: 16/990,458

(22) Filed: Aug. 11, 2020

(65) Prior Publication Data

US 2022/0052935 A1 Feb. 17, 2022

(51) Int. Cl.
| | |
|---|---|
| H04L 43/0852 | (2022.01) |
| G06F 16/901 | (2019.01) |
| G06F 30/34 | (2020.01) |
| H04L 47/56 | (2022.01) |
| H04L 47/74 | (2022.01) |
| H04L 47/80 | (2022.01) |
| H04L 47/83 | (2022.01) |

(52) U.S. Cl.
CPC ...... *H04L 43/0852* (2013.01); *G06F 16/9017* (2019.01); *G06F 30/34* (2020.01); *H04L 47/56* (2013.01); *H04L 47/745* (2013.01); *H04L 47/801* (2013.01); *H04L 47/805* (2013.01); *H04L 47/83* (2022.05)

(58) Field of Classification Search
CPC ... H04L 43/0852; H04L 47/56; H04L 47/745; H04L 47/801; H04L 47/805; H04L 47/83; G05F 16/9017; G06F 30/34
See application file for complete search history.

(56) References Cited

U.S. PATENT DOCUMENTS

| | | | | |
|---|---|---|---|---|
| 7,669,029 | B1 * | 2/2010 | Mishra | G06F 11/3433 711/170 |
| 11,088,959 | B1 * | 8/2021 | Amicangioli | H04L 47/28 |

(Continued)

OTHER PUBLICATIONS

K. Danne, et al., "Server-based execution of periodic tasks on dynamically reconfigurable hardware," IET Computers & Digital Techniques, Jul. 2007, pp. 295-302, vol. 1.

(Continued)

*Primary Examiner* — Hassan A Phillips
*Assistant Examiner* — Anthony Luo
(74) *Attorney, Agent, or Firm* — Harness, Dickey & Pierce, P.L.C.

(57) ABSTRACT

A method for allocating resources of a field-programmable gate array (FPGA), the method comprising: deterministically estimating a maximum latency for executing a network service at the FPGA; determining that the maximum latency is less than a threshold latency value associated with the network service; outputting an acknowledgement indicating that the maximum latency is less than or equal to the threshold latency value; receiving confirmation that the FPGA has been selected to execute the network service within a threshold time period; and deterministically scheduling the resources of the FPGA for executing the network service in response to receiving the confirmation within the threshold time period.

19 Claims, 5 Drawing Sheets

(56) References Cited

U.S. PATENT DOCUMENTS

| | | | | |
|---|---|---|---|---|
| 2019/0081832 | A1* | 3/2019 | Marinier | H04L 5/0007 |
| 2019/0239248 | A1* | 8/2019 | Zhang | H04W 76/27 |
| 2020/0153921 | A1* | 5/2020 | Kolluri Venkata Sesha | H04L 67/16 |
| 2021/0007105 | A1* | 1/2021 | Kawasaki | H04L 5/0051 |
| 2021/0014017 | A1* | 1/2021 | Zhou | H04L 5/0044 |
| 2021/0075501 | A1* | 3/2021 | Xu | H04B 7/18519 |
| 2021/0212043 | A1* | 7/2021 | Ryu | H04W 72/02 |
| 2021/0266651 | A1* | 8/2021 | Luo | H04L 47/522 |
| 2021/0392021 | A1* | 12/2021 | Horn | H04L 5/0051 |

OTHER PUBLICATIONS

A. F. Mills et al., "A Multiprocessor Server-Based Scheduler for Soft Real-Time Tasks with Stochastic Execution Demand," in 2011 IEEE 17th International Conference on Embedded and Real-Time Computing Systems and Applications, Aug. 2011, pp. 207-217.

L. Nogueira, et al., "Server-based Scheduling of Parallel Real-time Tasks," in Proceedings of the tenth ACM International conference on Embedded software, Oct. 2012, pp. 73-82.

H. Topcuoglu, et al., "Performance-effective and low complexity task scheduling for heterogeneous computing," IEEE Transactions on Parallel and Distributed Systems, Mar. 2002, vol. 13, No. 3, pp. 260-274.

A. Diavastos, et al., "Auto-tuning Static Schedules for Task Dataflow Applications," in ANDARE'17, Sep. 2017, article No. 1, pp. 1:1-1:6.

S. M. Loo, et al., "Task scheduling in a finite-resource, reconfigurable hardware/software codesign environment," Informs J.on Computing, Jan. 2006, vol. 18, No. 2.

J. Teller et al., "Scheduling tasks on reconfigurable hardware with a list scheduler," in 2009 IEEE International Symposium on Parallel & Distributed Processing, May 2009, pp. 1-4.

W. Housseyni, et al., "Real-Time Scheduling of Reconfigurable Distributed Embedded Systems with Energy Harvesting Prediction," in 2016 IEEE/ACM 20th International Symposium on Distributed Simulation and Real Time Applications (DS-RT), Sep. 2016, pp. 145-152.

J. E. Sim, et al., "Optimal Placement-aware Trace-Based Scheduling of Hardware Reconfigurations for FPGA Accelerators," in 2009 17th IEEE Symposium on Field Programmable Custom Computing Machines, Apr. 2009, pp. 279-282.

M. D. Santambrogio, et al., "Task graph scheduling for reconfigurable architectures driven by reconfigurations hiding and resources reuse," in GLSVLSI '09, May 2009, pp. 21-26.

A. Jacobs, et al., "Task scheduling for reconfigurable systems in dynamic fault-rate environments," in 2013 IEEE High Performance Extreme Computing Conference, Sep. 2013, pp. 1-6.

M. Gotz, "Run-Time Reconfigurable RTOS for Reconfigurable Systems-on-Chips," Ph.D. dissertation, Faculty of Computer Science, Electrical Engineering and Mathematics, University of Paderborn, 2007, Germany.

Industry's First ACAP, "adaptive Compute Acceleration Platform—What's an ACAP," https://www.xilinx.com/products/silicon-devices/acap/versal.html retrieved on Jun. 2020.

J. Weerasinghe, et al., "Enabling FPGAs in Hyperscale Data Centers", IEEE, Aug. 10-14, 2015.

H. Loukil et al., "Design implementation on FPGA of H.264/AVC intra decision frame", International Journal of Computer Science, Engineering and Applications (IJCSEA) vol. 1, No. 5, Oct. 2011.

* cited by examiner

DYNAMIC AND DETERMINISTIC ACCELERATION OF NETWORK SCHEDULING FOR SHARED FPGAS

BACKGROUND

A field-programmable gate array (FPGA) is an integrated circuit designed to be configured after manufacturing. FPGAs contain an array of Configurable Logic Blocks (CLBs), and a hierarchy of reconfigurable interconnects that allow these blocks to be wired together, like many logic gates that can be inter-wired in different configurations. CLBs can be configured to perform complex combinational functions, or merely simple logic gates like AND and XOR. CLBs also include memory blocks, which may be simple flip-flops or more complete blocks of memory, and specialized Digital Signal Processing blocks (DSPs) preconfigured to rapidly execute some common operations (e.g., filters).

FPGAs can be reprogrammed to implement different logic functions, allowing flexible reconfigurable computing as performed in computer software.

SUMMARY

The scope of protection sought for various embodiments of the invention is set out by the independent claims. The example embodiments and/or features, if any, described in this specification that do not fall under the scope of the independent claims are to be interpreted as examples useful for understanding various embodiments.

One or more example embodiments may support determinism and dynamic reaction to external requests for network services, in the context of multi-tenant reconfigurable systems.

According to one or more example embodiments, chosen FPGA resources are spatially and temporally assigned to (scheduled for) each user (network service) taking into account constraints (e.g., latency, throughput, etc.) and requirements (e.g., quality of service, etc.) in a deterministic time.

At least one example embodiment provides a method for allocating resources of a field-programmable gate array (FPGA), the method comprising: deterministically estimating a maximum latency for executing a network service at the FPGA; determining that the maximum latency is less than a threshold latency value associated with the network service; outputting an acknowledgement indicating that the maximum latency is less than or equal to the threshold latency value; receiving confirmation that the FPGA has been selected to execute the network service within a threshold time period; and deterministically scheduling the resources of the FPGA for executing the network service in response to receiving the confirmation within the threshold time period.

At least one other example embodiment provides a non-transitory computer-readable storage medium storing computer-readable instructions that, when executed by at least one processor at a network apparatus, cause the network apparatus to perform a method for allocating resources of a field-programmable gate array (FPGA), the method comprising: deterministically estimating a maximum latency for executing a network service at the FPGA; determining that the maximum latency is less than a threshold latency value associated with the network service; outputting an acknowledgement indicating that the maximum latency is less than or equal to the threshold latency value; receiving confirmation that the FPGA has been selected to execute the network service within a threshold time period; and deterministically scheduling the resources of the FPGA for executing the network service in response to receiving the confirmation within the threshold time period.

According to one or more example embodiments, the method may further include outputting a result of the deterministically scheduling in a deterministic time, the result indicating completion of the deterministically scheduling.

According to one or more example embodiments, the deterministically scheduling the resources may include: mapping the network service to a slot of the FPGA including the resources; selecting an implementation of a scheduling algorithm for configuring the resources to execute one or more requested functions of the network service; and scheduling the FPGA resources according to the implementation of the scheduling algorithm.

The selecting may select the implementation of the scheduling algorithm from a look up table.

The selecting may select the implementation of the scheduling algorithm based on a dependency graph representation of the network service, a deadline for the network service to be executed, and a time window for which the resources are allowed to execute.

The method may further include determining that the maximum latency is greater than a threshold latency value associated with the network service; and outputting a negative acknowledgement indicating that the maximum latency is greater than the threshold latency value.

At least one other example embodiment provides a network apparatus for allocating resources of a field-programmable gate array (FPGA), the method comprising: means for deterministically estimating a maximum latency for executing a network service at the FPGA; means for determining that the maximum latency is less than a threshold latency value associated with the network service; means for outputting an acknowledgement indicating that the maximum latency is less than or equal to the threshold latency value; means for receiving confirmation that the FPGA has been selected to execute the network service within a threshold time period; and means for deterministically scheduling the resources of the FPGA for executing the network service in response to receiving the confirmation within the threshold time period.

According to one or more example embodiments, the network apparatus may further include means for outputting a result of the deterministically scheduling in a deterministic time, the result indicating completion of the deterministically scheduling.

The means for deterministically scheduling the resources may include: means for mapping the network service to a slot of the FPGA including the resources; means for selecting an implementation of a scheduling algorithm for configuring the resources to execute one or more requested functions of the network service; and means for scheduling the FPGA resources according to the implementation of the scheduling algorithm.

The means for selecting may select the implementation of the scheduling algorithm from a look up table.

The means for selecting may select the implementation of the scheduling algorithm based on a dependency graph representation of the network service, a deadline for the network service to be executed, and a time window for which the resources are allowed to execute.

The network apparatus may further include means for determining that the maximum latency is greater than a threshold latency value associated with the network service;

and means for outputting a negative acknowledgement indicating that the maximum latency is greater than the threshold latency value.

At least one other example embodiment provides a network apparatus for allocating resources of a field-programmable gate array (FPGA), the network apparatus comprising: at least one processor and at least one memory including computer program code. The at least one memory and the computer program code are configured to, with the at least one processor, cause the network apparatus to: deterministically estimate a maximum latency for executing a network service at the FPGA, determine that the maximum latency is less than a threshold latency value associated with the network service, output an acknowledgement indicating that the maximum latency is less than or equal to the threshold latency value, receive confirmation that the FPGA has been selected to execute the network service within a threshold time period, and deterministically schedule the resources of the FPGA for executing the network service in response to receiving the confirmation within the threshold time period.

The at least one memory and the computer program code may be configured to, with the at least one processor, cause the network apparatus to output a result of the deterministically scheduling in a deterministic time, the result indicating completion of the deterministically scheduling.

The at least one memory and the computer program code may be configured to, with the at least one processor, cause the network apparatus to deterministically schedule the resources of the FPGA by mapping the network service to a slot of the FPGA including the resources, selecting an implementation of a scheduling algorithm for configuring the resources to execute one or more requested functions of the network service, and scheduling the FPGA resources according to the implementation of the scheduling algorithm.

The at least one memory and the computer program code may be configured to, with the at least one processor, cause the network apparatus to select the implementation of the scheduling algorithm from a look up table.

The at least one memory and the computer program code may be configured to, with the at least one processor, cause the network apparatus to select the implementation of the scheduling algorithm based on a dependency graph representation of the network service, a deadline for the network service to be executed, and a time window for which the resources are allowed to execute.

The at least one memory and the computer program code may be configured to, with the at least one processor, cause the network apparatus to determine that the maximum latency is greater than a threshold latency value associated with the network service, and output a negative acknowledgement indicating that the maximum latency is greater than the threshold latency value.

At least one other example embodiment provides a method for allocating field-programmable gate array (FPGA) resources, the method comprising: mapping a network service to a slot of resources of the FPGA; selecting an implementation of a scheduling algorithm for configuring the slot of resources to execute one or more functions of the network service; scheduling resources within the slot of resources according to the implementation of the scheduling algorithm; and outputting a result of the scheduling the resources within the slot of resources in a deterministic time, the result indicating completion of the scheduling the resources within the slot of resources.

At least one other example embodiment provides a non-transitory computer-readable storage medium storing computer-readable instructions that, when executed by at least one processor at a network apparatus, cause the network apparatus to perform a method for allocating field-programmable gate array (FPGA) resources, the method comprising: mapping a network service to a slot of resources of the FPGA; selecting an implementation of a scheduling algorithm for configuring the slot of resources to execute one or more functions of the network service; scheduling resources within the slot of resources according to the implementation of the scheduling algorithm; and outputting a result of the scheduling the resources within the slot of resources in a deterministic time, the result indicating completion of the scheduling the resources within the slot of resources.

At least one other example embodiment provides a network apparatus for allocating resources of a field-programmable gate array (FPGA), the network apparatus comprising: means for mapping a network service to a slot of resources of the FPGA; means for selecting an implementation of a scheduling algorithm for configuring the slot of resources to execute one or more functions of the network service; means for scheduling resources within the slot of resources according to the implementation of the scheduling algorithm; and means for outputting a result of the scheduling the resources within the slot of resources in a deterministic time, the result indicating completion of the scheduling the resources within the slot of resources.

At least one other example embodiment provides a network apparatus for allocating resources of a field-programmable gate array (FPGA), the network apparatus comprising: at least one processor and at least one memory including computer program code. The at least one memory and the computer program code are configured to, with the at least one processor, cause the network apparatus to: map a network service to a slot of resources of the FPGA, select an implementation of a scheduling algorithm for configuring the slot of resources to execute one or more functions of the network service, schedule resources within the slot of resources according to the implementation of the scheduling algorithm, and output a result of the scheduling the resources within the slot of resources in a deterministic time, the result indicating completion of the scheduling the resources within the slot of resources.

According to one or more example embodiments, the outputting may output the result of the scheduling the resources in the deterministic time independent of completion of the scheduling.

The implementation may be a bitstream for scheduling the resources within the slot.

The selecting may select the implementation of the scheduling algorithm from a look up table.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of this disclosure.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. The use of similar or identical reference numbers in the various drawings is intended to indicate the presence of a similar or identical element or feature.

DETAILED DESCRIPTION

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. The example embodiments may, however, be embodied in many alternate forms and should not be construed as limited to only the embodiments set forth herein.

Accordingly, while example embodiments are capable of various modifications and alternative forms, the embodiments are shown by way of example in the drawings and will be described herein in detail. It should be understood, however, that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

In modern cloud-based data centers, servers may be equipped with reconfigurable hardware (e.g., field programmable gate arrays (FPGAs)), which is used to accelerate the computation of data-intensive and/or time-sensitive computations. Current data centers do not, however, allow this reconfigurable hardware to be shared among multiple tenants (users) at run-time. So-called multi-tenancy allows network operators/manufacturers to generate more revenue than in the single-tenant case because the same reconfigurable hardware resource (e.g., FPGA) may be rented to multiple users.

Because the functionality of hardware circuitry of FPGAs may be changed at run-time, FPGAs may be managed in terms of space slots. A user is not only assigned the use of a portion of the FPGA resources (CLBs, DSPs, memory blocks, etc.) for a given amount of time, but also assigned a spatial (geometrical) configuration of these resources.

One or more example embodiments provide methods, devices and/or non-transitory computer-readable mediums that deterministically decide an execution order for computations in shared FPGAs, and execute services (e.g., network services) according to the execution order for the computations.

According to at least some example embodiments, deterministic refers to a solution to the problem being retrieved in a deterministic (known, fixed) time while the system evolves at run-time (e.g., users become active/inactive, workload changes, etc.).

At least one example embodiment utilizes a unique property of some accelerators (e.g., FPGAs, System-on-Chips (SoCs), ACAPs, etc.) to produce an algorithm response in a given (deterministic) time, thereby enabling deterministic identification of a solution to the scheduling problem for multi-tenant accelerator platforms. Indeed, some accelerator platforms (e.g., FPGAs) are capable of calculating the results of some implemented algorithm in a given set of clock periods (in nanosecond (ns) time scale) for a certain set of sizes of the input to the algorithm, which makes such hardware accelerators eligible to be used in the deterministic applications. At least one example embodiment, however, utilizes the above-mentioned unique feature to schedule applications on the resources in complex hardware platforms deterministically, which is one of the key requirements for automatic network service applications in Fifth Generation (5G) computer networks and 5G cloud-native data centers. Deterministic network service allocation may also provide savings (e.g., significant savings) in network resources, since the process of service allocation has known starting and ending times, and better resource optimization may be achieved.

One or more example embodiments may be executed via a plugin together with a network orchestrator (e.g., Kubernetes, OpenStack, etc.) or as a dedicated hardware module executed on the accelerator (e.g., FPGA) hardware.

For example purposes, example embodiments will be discussed herein with regard to a FPGA. However, example embodiments should not be limited to this example. Rather, one or more example embodiments may also be applicable to any other type of the acceleration platforms (different than FPGA), that have the same or substantially the same deterministic response properties.

Figure 1:
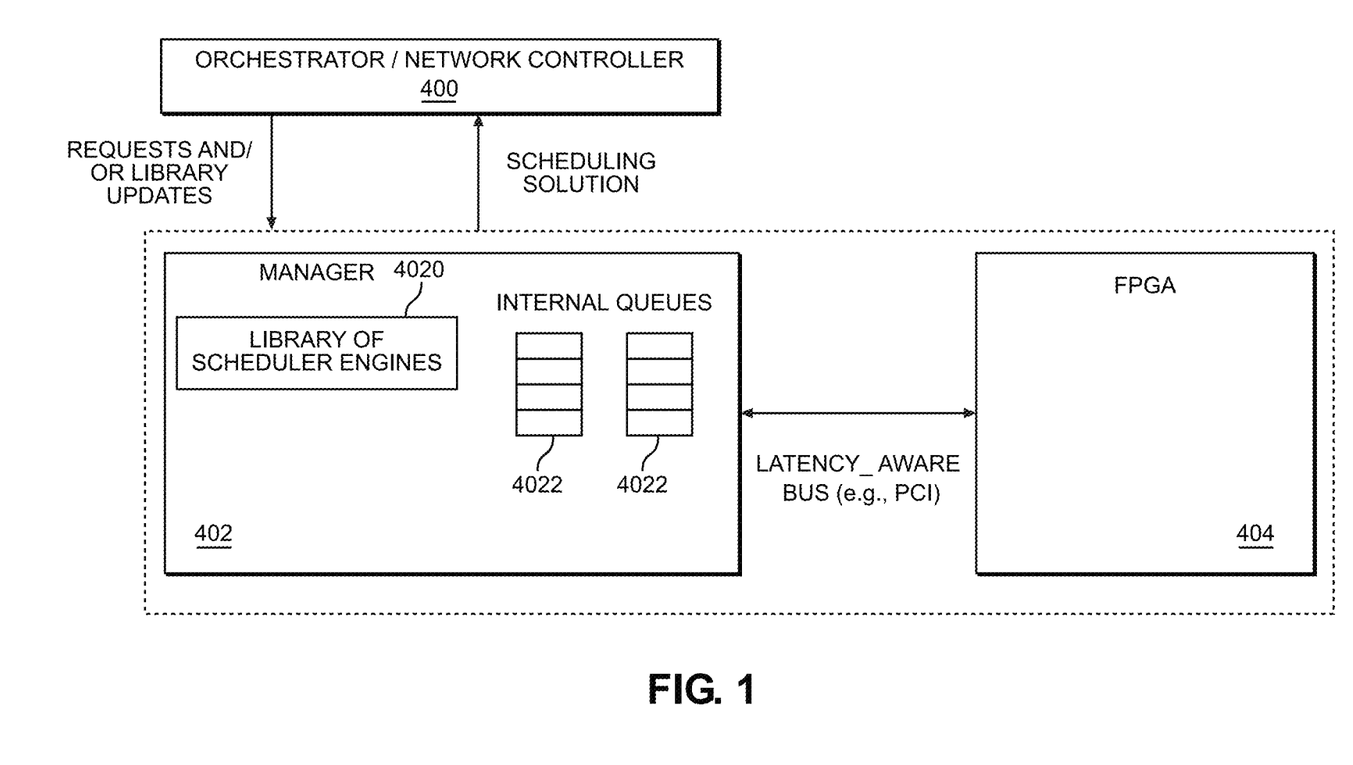
FIG. 1 is a system-level view illustrating hardware and software layers according to example embodiments.

FIG. 1 is a system-level view illustrating hardware and software layers according to example embodiments.

Referring to FIG. 1, the system includes a network orchestrator (or network controller) 400 in two-way communication with a manager 402. The manager 402 is also configured to interface with a FPGA 404 via a latency-aware bus (e.g., a Peripheral Component Interconnect (PCI) bus). The manager 402 also includes internal queues 4022 and a library of schedulers (or library of schedule engines) 4020 to implement one or more scheduling algorithms.

The library of schedulers 4020 is composed of bitstreams of scheduling algorithms for configuration of the FPGA 404. Bitstreams are classified based on characteristics of algorithms and selected (e.g., automatically selected) using, for example, a Look Up Table (LUT) containing the first address of the stored bitstream in a database. Parameters such as the specific scheduling algorithm to use (e.g., Earliest Date First, Earliest Due Date, etc.), resources available on the FPGA 404, the desired minimum/maximum processing latency and/or throughput, etc. may be used to address the LUT. The combination of these parameters forms a unique key to access a single bitstream in the database. Selection of a bitstream from the library of schedulers 4020 will be discussed in more detail later.

The internal queues 4022 store communications (e.g., messages, requests, or the like) between the network controller 400 and the manager 402. According to at least one example embodiment, two internal queues 4022 may be used to store communications from the network orchestrator 400. In this example, a first of the internal queues 4022 may store user requests to deploy a network service on the FPGA 404. A second of the internal queues 4022 may be used to store feedback messages. A feedback message contains information about the actual performance (e.g., latency, throughput, or the like) of a scheduling solution for a user request that was previously deployed. The manager 402 utilizes feedback information to compute a key to access the database of scheduling engines. A third of the internal queues 4022 maybe used to store mapping/scheduling policies used by the manager 402, as discussed in more detail later. For example purposes, example embodiments are discussed with regard to utilization of three scheduling queues. However, example embodiments should not be limited to this example. Rather, the number of scheduling queues may depend on specific implementation.

The FPGA 404 may include a plurality of slots for hosting applications or services including functions.

According to at least one example embodiment, the FPGA 404 (or accelerator) may be configured to, among other things, execute a module referred to as scheduler engine, which implements an algorithm to determine an execution order for computations, given a performance objective. The objective and the characteristics of the system to be explored are stored in the FPGA 404 in on-chip memory. The scheduler engine reads these data, performs some computations in a deterministic time (defined by the manager 402 as requested by the network orchestrator 400) and returns the result to the manager 402, which in turn returns the result to the network orchestrator 400. Characteristics of the system may include a graph of the target network, characteristics of the network services (e.g., CPU load, memory load, etc.), dependencies between services, etc. An instance of the scheduler engine for a user is shown as Bitstream implementing EDF algorithm to schedule user Y (UY) in FIG. 5.

Functions within applications or services, such as network services, may be independent of one another or present dependencies that partially specify an execution order. A dependency graph is a model used to specify an application, such as a network service. Dependency graphs are used to specify these dependencies. The FPGA 404 will be discussed in more detail later.

Figure 6:
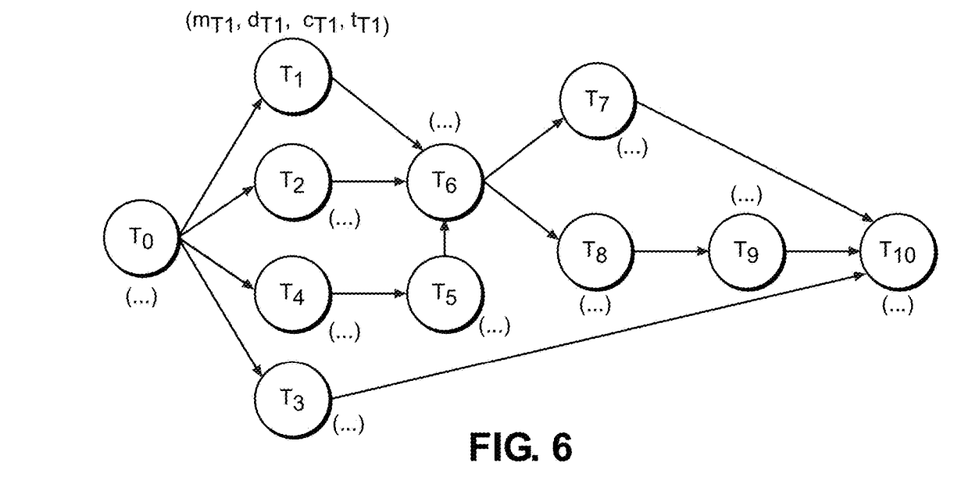
FIG. 6 illustrates an example dependency graph according to example embodiments.

FIG. 6 illustrates an example dependency graph according to example embodiments.

The example shown in FIG. 6 is a directed annotated graph. Each node in the graph represents a task $T_n$ and is annotated with information that specifies the consumption of FPGA resources for the task $T_n$ (e.g., number of memory blocks, DSP blocks, configurable logic blocks, etc.) and timing information (e.g., processing time or latency, etc.). The consumption of FPGA resources and timing information may also be referred to as performance characteristics for the task.

Tasks are connected by edges. Each edge in the graph denotes data and/or control dependencies between the tasks. The dependencies constrain the execution order of tasks. For example, the edge from task $T_1$ to $T_6$ means that execution of task $T_1$ must precede execution of task $T_6$.

Still referring to FIG. 6, performance characteristics for a task may be represented and annotated by a tuple. An example of a tuple that annotates a given task is: $(m_{Tn}, d_{Tn}, c_{Tn}, t_{Tn})$, where $m_{Tn}$ indicates the number of memory blocks, $d_{Tn}$ is the number of DSPs, $c_{Tn}$ is the number of configurable logic blocks and $t_{Tn}$ is the processing time. However, example embodiments should not be limited to these examples. Rather, other performance characteristics such as network bandwidth consumption, power consumption, etc. may be envisaged. As discussed in more detail later, the performance characteristics for tasks within a service may be taken into account by the manager 402 when scheduling FPGA resources in response to a request for service.

Figure 4:
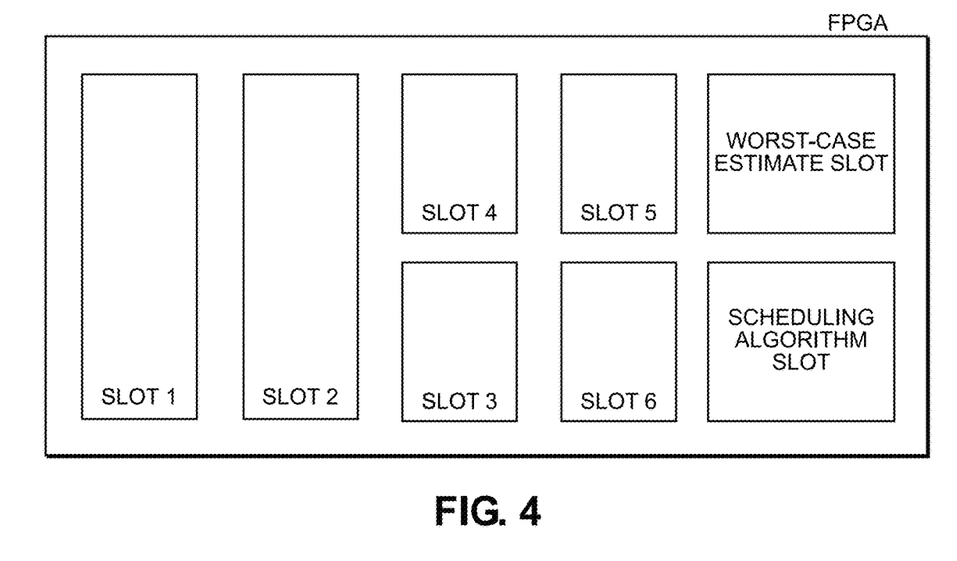
FIG. 4 is a block diagram illustrating an empty (virgin) configuration of an FPGA including eight slots, according to example embodiments.

FIG. 4 is a block diagram illustrating an empty (virgin) configuration of an FPGA including eight slots, according to example embodiments. In this example, slots 1-6 are prepared to each host the execution of a network service. The FPGA also includes a worst-case estimate slot and a scheduling algorithm slot. The worst-case estimate slot is reserved to compute an estimate of the worst-case service time (latency) as will be discussed in more detail later. The scheduling algorithm slot is reserved to execute the scheduling algorithm implementation (e.g., bitstream implementing EDF algorithm) selected by the manager 402, which will also be discussed in more detail later.

Although the example embodiment shown in FIG. 4 includes eight slots, example embodiments should not be limited to this example. Rather, example embodiments may be applicable to FPGAs with any number of slots. The slots in FIG. 4 have different sizes to better accommodate a variety of different functions and services. However, within a FPGA, slots may be the same or different sizes.

Figure 5:
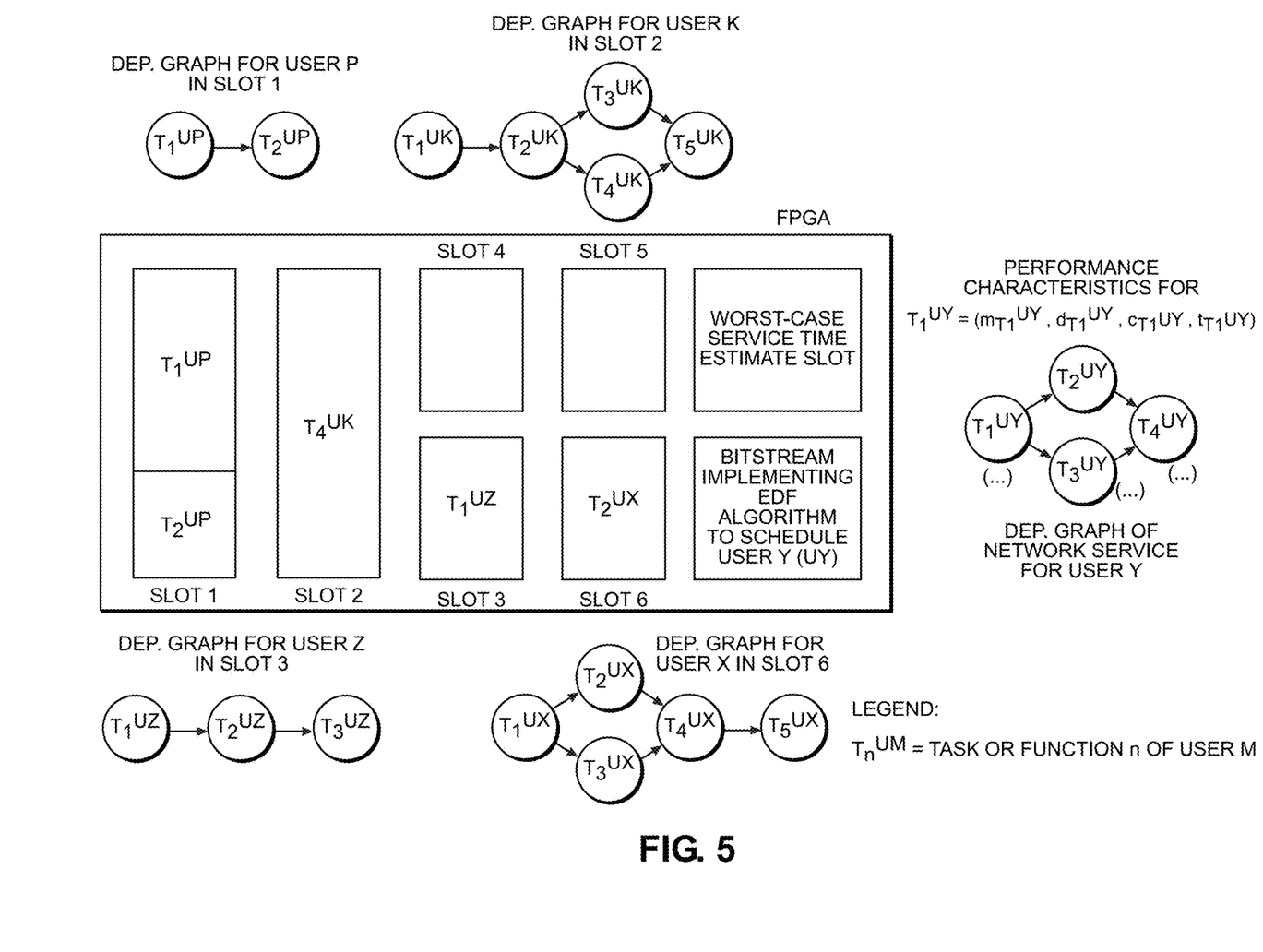
FIG. 5 is a block diagram illustrating an example occupation of FPGA resources of an FPGA according to example embodiments.

FIG. 5 is a block diagram illustrating an example occupation of FPGA resources of the FPGA shown in FIG. 4. In this example, slots 1-3 and 6 are busy executing a network service and the scheduling algorithm slot is busy computing an execution order for a forthcoming network service. Slots 4 and 5 are not busy and able to host a new service identified in a request from the network orchestrator 400. In this example, depending on the spatial allocation algorithm for the FPGA, slot 4 or 5 may be used to accommodate a new network service associated with a user (e.g., user Y) unless execution of the service for a user in one of the larger slots (e.g., User P in slot 1 or user K in slot 2) terminates in which case the larger slot may be assigned to the new service.

FIG. 5 also illustrates a dependency graph for the services associated with each of a plurality of users P, K, X, Y and Z.

As shown in FIG. 5, a task or function n for a network service associated with user M is represented by $T_n^{UM}$. Tasks $T_1^{UP}$ and $T_2^{UP}$ are currently running/executed on in Slot 1, task $T_4^{UK}$ is currently running/executed on Slot 2, task $T_1^{UZ}$ is currently running/executed on Slot 3, and task $T_2^{UX}$ is currently running/executed on Slot 6. As with the dependency graph discussed above with regard to FIG. 6, each task $T_n^{UM}$ in FIG. 5, has associated performance characteristics modeled in terms of four parameters (e.g., memory, number of DSPs, number of configurable logic blocks, and processing time).

FIGS. 4 and 5 illustrate a two-dimensional view of FPGA resource consumption, where slots and functions are represented as rectangles. This corresponds to modeling the consumption of FPGA resources for functions as a simple pair of parameters (e.g., memory and number of configurable logic blocks or memory and time). However, it should be noted that this is a simplified view. As discussed herein, the resource consumption of a function may be modeled in terms of four parameters (e.g., memory, number of DSPs, number of configurable logic blocks, and worst-case execution time). Consequently, the consumption of resources may be represented as four dimensional figures.

Returning to FIG. 1, the manager 402 selects implementation of a scheduling algorithm providing a solution that (i)

matches (e.g., best matches) requirements within a request for a network service from the network orchestrator 400 and (ii) respects the deterministic deadline when a solution is needed. For instance, the manager 402 takes into account whether a fast, but suboptimal solution, is needed in a short time, or a reliable solution (e.g., where computations are duplicated to support the malfunctioning of some components) is needed because of a faulty environment, etc. The manager 402 then configures the resources of the FPGA 404 with the selected implementation (bitstream) of a scheduling algorithm (outputting the bitstream implementing EDF algorithm), loads the input data for the algorithm in memory (e.g., application dependency graph), triggers execution of the implementation and awaits for a notification from the FPGA 404 upon completion of the implementation.

The manager 402 then informs the network orchestrator 400 of the completion in a deterministic time. Based on the performance characteristics of the hardware architecture and the characteristics of the selected scheduler implementation (bitstream), the manager 402 guarantees the return of a solution to the network orchestrator 400 in a deterministic time.

The request for a network service may be a request to execute functions as part of a network service requested by a user. According to at least one example embodiment, the request may include (i) application bitstreams with the functions to be accelerated by the FPGA 404, (ii) the duration of the time window during which a user is granted access to the FPGA 404, and (iii) a set of performance requirements/constraints (latency, throughput, etc.) that must be respected by the final scheduling.

The duration of the time window determines an upper bound (deadline) for the execution of applications. The set of performance constraints define the quality of service the user paid for and constrain the schedule.

In one example, a request r from the network orchestrator 400 may be given by Equation (1) shown below.

$$r = <D, d, t> \quad (1)$$

In Equation (1), D is the dependency graph representation of the network service to be scheduled, d is the deadline for the network service to be executed, and t is a time window for which FPGA resources are allowed to execute the dependency graph D. In one example, the time window t represents the duration of time that the user requesting the network service has paid to rent the FPGA resources. The deadline d may be greater than the time window as some time is necessary for the manager 402 to take control-related decisions and to configure the FPGA resources.

Figure 2:
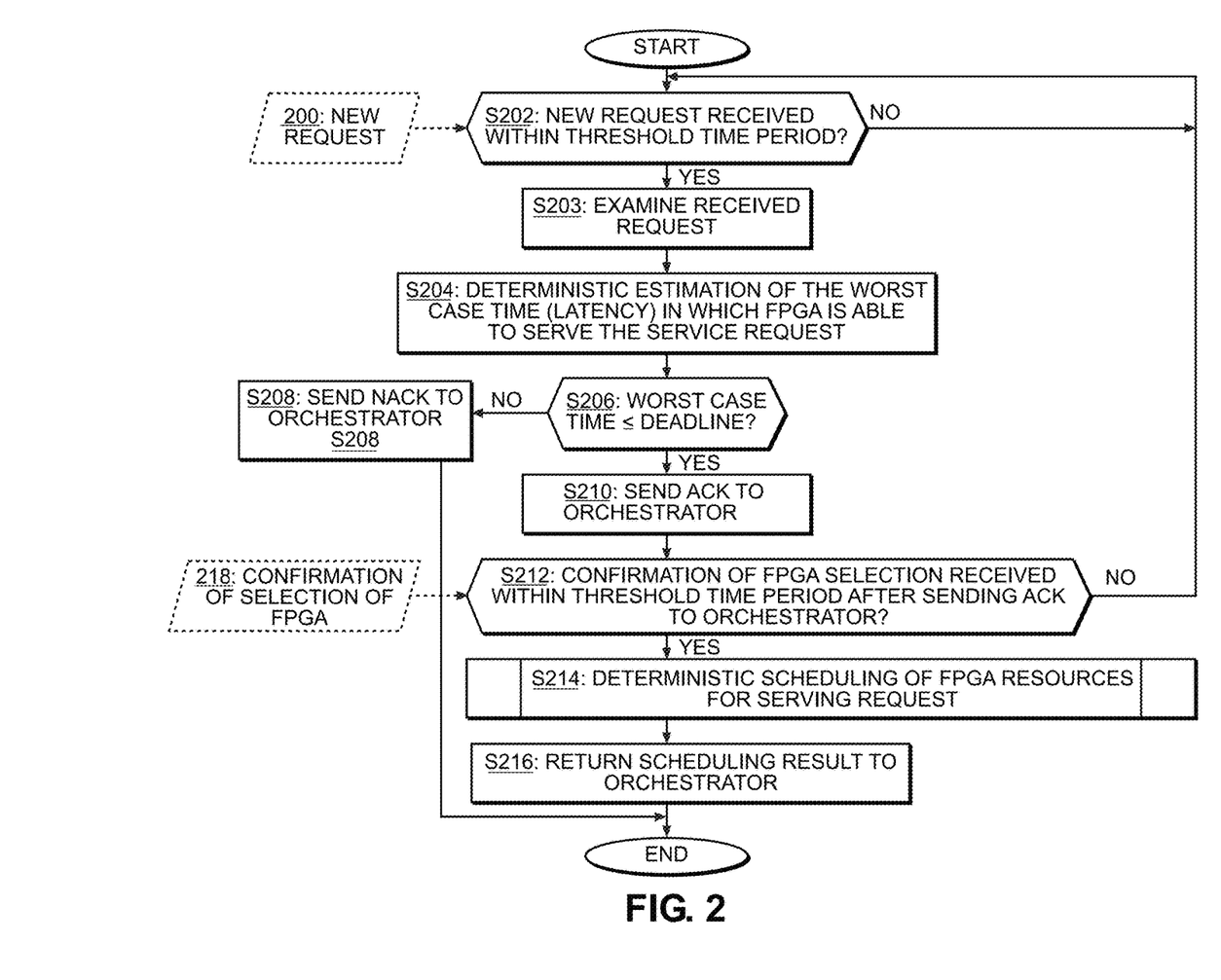
FIG. 2 is a flow chart illustrating a method according to example embodiments.

FIG. 2 is a flow chart illustrating a method according to example embodiments. The method shown in FIG. 2 may be performed at the manager 402 shown in FIG. 1, and will be described as such for example purposes. It should be understood, however, that example embodiments are not limited to this example. Rather, the example embodiment shown in FIG. 2 may be performed, for example, at the network orchestrator 400, distributed among multiple different network elements, or at any other network element.

Referring to FIG. 2, at step S202 the manager 402 determines whether a new request 200 for a network service has been received within a threshold time period since the most recent prior request. According to one or more example embodiments, the threshold time period is a control plane time, which may be on a microsecond scale. In one example, the threshold time period may be a value greater than or equal to the round-trip time (RTT) between the network orchestrator 400 and the manager 402.

An example length of the threshold time period may vary from few μs to few ms. Indeed, the exact value may depend on the round-trip time (RTT) between a controller and the network apparatus in which example embodiments are implemented, but also from the reactivity of the control plane (typically in ms). In case these two entities (controller and network apparatus) are directly connected, then RTT may be some μs. RTT may increase up to some tens of μs in case the two entities are not directly connected.

If the manager 402 receives a new request within the threshold time period, then at step S203 the manager 402 examines the request to identify the parameters of the network service being requested. Parameters include the elements of the request discussed above as well as, for example, a representation of the services and network architectures, the desired performance objectives of the solution (e.g., minimum latency, maximum throughput, etc.), etc.

At step S204, the manager 402 computes an estimate of the worst-case service time (latency) at which the requested network service can be served (services/requests are queued). The computation of the worst-case time may be performed at a slot in the FPGA 404, which may be reserved for this computation. In the example shown in FIG. 5, this slot is the "Worst-case estimate slot." In at least one example embodiment, the manager 402 may compute the estimate of the worst-case time using, for example, a first-fit instance of the bin packing algorithm applied to the smallest slot in the FPGA 404. The choice for this estimation algorithm may also be updated at run-time by the network orchestrator 400. According to one or more example embodiments, the first-fit instance of the bin packing algorithm applied to the smallest slot in the FPGA 404 may be used when tasks are modeled with two parameters. It should be understood, however, that other algorithms and/or heuristics may be used depending on the number of parameters are used to model a task's resources.

At step S206, the manager 402 compares the estimated worst-case time with a deadline (or threshold latency) at which the network orchestrator 400 requires the network service to be completed. The manager 402 determines or obtains the deadline (or threshold latency) from the request. The deadline (or threshold latency) may depend on the characteristics of the specific service being requested (e.g., service's latency, the set-up time necessary to prepare the execution environment, or the like) and the rental length.

If the manager 402 determines that the requested network service cannot be completed by the deadline (e.g., the worst-case service time or latency determined at step S204 is greater than the threshold latency), then at step S208 the manager 402 sends a negative acknowledgement (NACK) to the network orchestrator 400 indicating that the requested network service cannot be served at the FPGA 404. In this case, the method shown in FIG. 2 terminates, and the network orchestrator 400 may poll the manager of another FPGA to perform the network service.

Returning to step S206, if the manager 402 determines that the FPGA 404 is able to complete execution of the network service by the deadline (e.g., the worst-case service time or latency determined at step S204 is less than or equal to the threshold latency), then at step S210 the manager 402 sends an acknowledgement (ACK) to the network orchestrator 400 indicating that the requested network service can be served at the FPGA 404.

In response to receiving the acknowledgement from the manager 402, the network orchestrator 400 determines whether to select the manager 402 and FPGA 404 to perform the requested network service. If the network orchestrator 400 selects the manager 402 and the FPGA 404 to perform the network service, then the network orchestrator 400 sends a confirmation 218 to the manager 402 indicating that the manager 402 and the FPGA 404 have been selected. If the network orchestrator 400 does not select the manager 402 and FPGA 404, then the network orchestrator 400 does not send the confirmation 218.

According to at least one example embodiment, the network orchestrator 400 may select a manager to perform a network service from among a pool of candidate managers associated with, or located in, different FPGAs based on a service latency associated with each manager in the pool of candidate managers. In one example, the network orchestrator 400 may select the manager associated with the minimum service latency among the pool of candidate managers, wherein the network orchestrator 400 obtains the service latency from each manager by polling the managers in the pool of candidate managers. The service latency associated with each manager may be based on FPGA characteristics (e.g., the current workload, the FPGA's rent, the FPGA's maximum clock frequency, or the like) for FPGAs associated with the respective manager.

Still referring to FIG. 2, at step S212, if the manager 402 does not receive the confirmation 218 of selection of the manager 402 and the FPGA 404 from the network orchestrator 400 within a threshold time period after outputting the acknowledgment, then the process returns to step S202 and continues as discussed herein. The threshold time period after outputting the acknowledgement may be a latency of the response from the orchestrator 400. In one example, the latency may be equal, or substantially equal, to the sum of Round Trip Time (RTT) and the processing latency of the network orchestrator 400. The resulting latency may be less than or equal to the threshold latency at step S202 in FIG. 2.

Returning to step S212, if the manager 402 receives the confirmation 218 from the network orchestrator 400 within the threshold time period, then at step S214 the manager 402 deterministically schedules resources of the FPGA 404 to execute the functions of the requested network service.

In more detail, according to at least one example embodiment, at step S214 the manager 402 identifies a slot at which to execute the network service (spatially maps the network service to a slot), decides the temporal allocation of the FPGA resources in the slot for all functions of the network service (scheduling of functions), and schedules the resources of the FPGA 404. A more detailed discussion of an example embodiment of step S214 will be provided later with regard to FIG. 3.

At step S216, the manager 402 returns the scheduling result to the network orchestrator 400.

According to one or more example embodiments, the bitstream that implements the selected scheduling algorithm sends, to the manager 402, a message including the solution to the problem of scheduling FPGA resources (scheduling result) for the functions of the network service on the selected slot. This message is delivered to the manager 402 after a deterministic time, and contains an execution order for functions in the dependency graph that respects the time allocated by the network orchestrator 400 (e.g., the deadline of the request).

The manager 402 may output the result of the scheduling the resources to the network orchestrator 400 in the deterministic time independent of completion of the scheduling.

An example of this scheduling result can be mathematically denoted as a set of tuples. For instance, for the network service for user X in FIG. 5, the set of tuples may be: $\{(time_1, T_1^{UX}, T_2^{UX}), (time_2, T_3^{UX}), (time_3, T_4^{UX}, T_5^{UX})\}$. This indicates that Slot 6 starts executing tasks $T_1^{UX}$ and $T_2^{UX}$ at time $time_1$. At time $time_2$, slot 6 begins executing task $T_3^{UX}$, and at time $time_3$, slot 6 starts execution of tasks $T_4^{UX}$ and $T_5^{UX}$.

As described above, the manager 402 records information about the status of the services being executed by the FPGA 404. In case no service is executing, the manager 402 returns to an idle state awaiting for new requests from the network orchestrator 400. When a service completes execution and its status is updated accordingly (e.g., it is marked as "completed"), the manager 402 returns the result to the network orchestrator 400.

Figure 3:
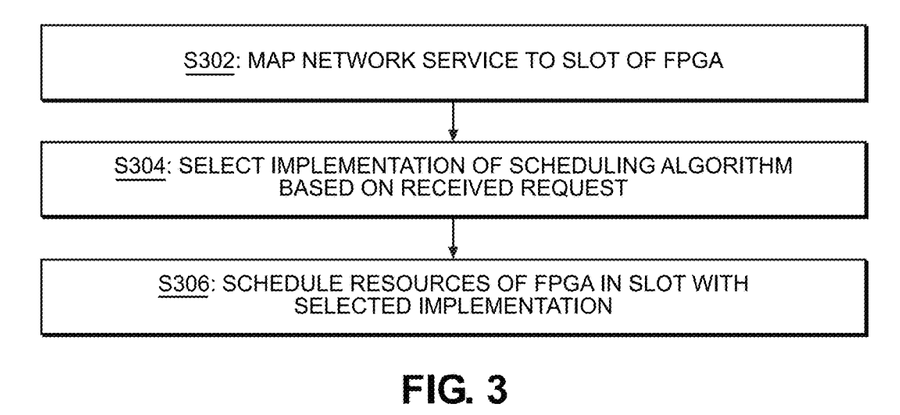
FIG. 3 is a flow chart illustrating a method according to example embodiments.

FIG. 3 is a flow chart illustrating a method for deterministically scheduling FPGA resources according to example embodiments. The method shown in FIG. 3 may be performed at the manager 402 shown in FIG. 1, and will be described as such for example purposes. It should be understood, however, that example embodiments are not limited to this example. Rather, the example embodiment shown in FIG. 3 may be performed, for example, at the network orchestrator 400, distributed among multiple different network elements, or any other network element. Moreover, the example embodiment shown in FIG. 3 will be discussed with regard to mapping of a network service to one slot of the FPGA 404. However, it should be understood that a network service may be executed across multiple slots.

Referring to FIG. 3, at step S302, the manager 402 spatially maps the network service to a slot of the FPGA 404.

According to one or more example embodiments, the manager 402 may utilize difference policies to spatially map network services to slots of the FPGA 404. Example policies include mapping the network service to an earliest available slot, a largest available slot, a least frequently used slot, any combination thereof or the like. For example, the manager 402 may utilize a policy in which the network service is mapped to the earliest and largest available slot. In this example, the manager selects the first free slot, but when multiple slots are available the manager 402 selects the largest slot from among the multiple slots. The network orchestrator 400 may update/change the policy used by the manager 402 at run-time. Regardless of the specific policy, the manager 402 records information concerning the state of running services (e.g., for each slot), the time to completion of a service, the number of services executed in a given temporal window, etc. This information is stored in memory. In one example, the information may be stored in a Look Up Table (LUT).

Once the network service is mapped to a slot of the FPGA 404, at step S304 the manager 402 selects an implementation of a scheduling algorithm, or scheduling bitstream, based on the received request from the network orchestrator 400.

In more detail, for example, at step S304 the manager 402 selects a bitstream for an Intellectual Property (IP) block implementing a specific scheduling algorithm based on the information contained in the request from the network orchestrator 400. The manager 402 may select a bitstream based on the nominal computational complexity of each implementation of a scheduling algorithm in the library of schedulers 4020, the size of the input network service to be scheduled, and the deadline d. In one example, a scheduling algorithm may be the Earliest Deadline First algorithm, and the manager 402 may compute the nominal complexity of the implementation in accordance with known methods.

In other examples, scheduling algorithms may be based on priority lists, wherein tasks in a dependency graph are sorted in a list according to some criteria/score. The priority list may then be traversed and tasks scheduled in order. In another example, scheduling algorithms may include grouping tasks in a dependency graph, sorting groups and then scheduling groups of tasks rather than individual tasks.

The size of the input network service may be indicated by the number of tasks in the dependency graph and the total resource occupancy of the graph (the sum of the resource occupancy of the individual tasks).

In one example, for all bitstreams in the library of schedulers 4020, the manager 402 computes a worst-case estimate of the service time required to nominally compute a schedule for the network service, and selects the bitstream capable of producing a solution within the deadline d.

According to one or more example embodiments, different protocols may be used to choose between computed schedules for two or more bitstreams. The choice of a bitstream may be based on performance criteria, such as, latency, throughput, power consumption of a scheduling solution, or the like. Thus, the manager 402 may first select a solution based on latency (e.g., pick the one with the lowest latency). If multiple solutions have the same latency, then the manager 402 may examine the throughput and choose the solution with the highest throughput. In case of equality the manager 402 may examine power consumption and select the solution with the lowest consumption. In case of still further equality, the manager 402 may make a random choice from among the bitstreams.

At step S306, the manager 402 schedules resources of the FPGA 404 in the slot based on the selected implementation of the scheduling algorithm. According to at least one example embodiment, the manager 402 schedules the resources of the FPGA 404 by outputting the selected bitstream to the FPGA 404 to program the FPGA 404 to execute the network service. The FPGA 404 then executes the network service using the scheduled FPGA resources.

Figure 7:
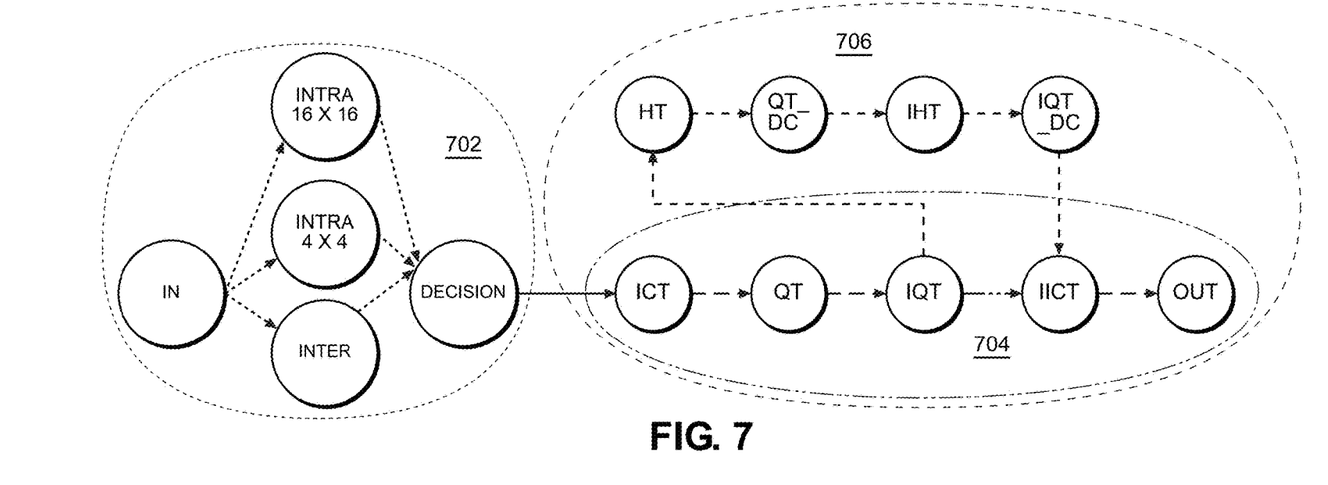
FIG. 7 illustrates an example implementation in accordance with the H.264 video encoding algorithm.

At least one example embodiment may be applicable to the H.264 video encoding algorithm, an example, which is described in more detail in A. Ben Atitallah, H. Loukil, N. Masmoudi: FPGA DESIGN FOR H.264/AVC ENCODER. In: International Journal of Computer Science, Engineering and Applications (IJCSEA) Vol. 1, No. 5, October 2011, is shown in FIG. 7. It should be understood that example embodiments are not be limited to this example.

Referring to FIG. 7, functions labeled "in" and "out" are the pure source and sink nodes, which respectively denote the emission and gathering of samples. These samples are transformed by the proper processing functions listed above.

The H.264 data flow shown in FIG. 7 illustrates two main datapaths: one for the Intra 16×16 prediction processing and one shared by Intra 4×4 and Inter predictions processing. These datapaths share a common set of functions 702.

According to one or more example embodiments, a datapath is chosen according to the type of processing, which is selected by the set of functions 702, depending on metrics, which are not discussed herein for the sake of brevity.

If the "inter" prediction or the "intra 4×4" prediction is selected, data samples are processed by the set of functions 704: Integer Cosine Transform (ICT), Quantization (QT), Inverse Quantization (IQT), Inverse ICT (IICT), out. If the "intra 16×16" prediction is selected, samples are processed by the set of functions 706: Integer Cosine Transform (ICT), Quantization (QT), Inverse Quantization (IQT), Hadamard Transform (HT), Quantization Transform Discrete Cosine (QT_DC), Inverse HT (IHT), Inverse QT_DC (IQT_DC), IICT, out.

According to at least some example embodiments, a slot of the FPGA shown in FIG. 4 may be allocated to an implementation of an entire H.264 algorithm. In one example, resources include: 90000 ALUTS, 540 DSPs, 360 blocks (1 block=36 kbit) of RAM for Slots 1 and 2, and half of these quantities for Slots 3-6.

The table below shows the occupancy, in term of resources, for each function. In this example, because the FPGA resources for the set of functions 704 are included in the resources consumed by the set of functions 706, the total occupancy is computed as the sum of the resources consumed by the sets of functions 702 and the resources consumed by the set of functions 706 (resources(702)+resources(706)).

| Function | ALUTs | DSP | RAM (Kbit) | Frequency (MHz) |
|---|---|---|---|---|
| 702 | 11158 | 0 | 127 (<1%) | 136 |
| 704 | 8649 | 64 | 8 | 221 |
| 706 | 20266 | 128 | 16 | 211 |
| Complete Design H.264 (702 + 706) | 31424 | 128 | 143 | 130 |

With reference to the tuple discussed with regard to FIG. 6, in the table shown above, ALUTs corresponds to parameter $c_{Tx}$ (the number of configurable logic blocks for function Tx), DSP corresponds to parameter $d_{Tx}$ (the number of DSP units for function Tx), RAM corresponds to parameter $m_{Tx}$ (the memory footprint of function Tx). The processing time $t_{Tx}$ may be provided for the following sets of functions rather than individual functions:

- 250 clock cycles at 136 MHz for the set of functions 702=1.84 micro-seconds
- 44 clock cycles at 221 MHz for the set of functions 704=200 nano-seconds
- 80 clock cycles at 211 MHz for the set of functions 706=379 nano-seconds According to one or more example embodiments, the determinism by the manager 402 is possible because sources of non-determinism (e.g., caches, interrupts, etc.) are not present in FPGAs. Thus, once execution begins at the FPGA 404, its completion time at the level of granularity of a single clock cycle is known.

Determinism is also possible because the complexity relation between the computation time of a scheduling solution and its input data (e.g., the dependency graph, the performance characteristics of each computation, etc.) is statically known. As the complexity typically depends on the workload (e.g., a solution is found in a number of iterations that depends on the input system to schedule), the manager 402 forces an upper bound on the number of computations that the scheduler performs.

One or more example embodiments may provide a deterministic scheduling of shared FPGA resources in a more cost sensitive way.

One or more example embodiments may enable dynamic reaction to real-time requests for deployment of new functions or the assignment of a FPGA to new users.

One or more example embodiments may allow for users to freely deploy their own designs in FPGAs, instead of being limited to a set of preconfigured applications offered by the cloud vendor.

One or more example embodiments may provide a mechanism to compute a schedule that may be customized according to the scenario/conditions of the execution environment (e.g., workload, quality of service, etc.).

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

As discussed herein, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at, for example, existing network apparatuses, elements or entities including cloud-based data centers, computers, cloud-based servers, or the like. Such existing hardware may be processing or control circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium," "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine-readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks. For example, as mentioned above, according to one or more example embodiments, at least one memory may include or store computer program code, and the at least one memory and the computer program code may be configured to, with at least one processor, cause a network apparatus, network element or network device to perform the necessary tasks. Additionally, the processor, memory and example algorithms, encoded as computer program code, serve as means for providing or causing performance of operations discussed herein.

A code segment of computer program code may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable technique including memory sharing, message passing, token passing, network transmission, etc.

The terms "including" and/or "having," as used herein, are defined as comprising (i.e., open language). The term "coupled," as used herein, is defined as connected, although not necessarily directly, and not necessarily mechanically. Terminology derived from the word "indicating" (e.g., "indicates" and "indication") is intended to encompass all the various techniques available for communicating or referencing the object/information being indicated. Some, but not all, examples of techniques available for communicating or referencing the object/information being indicated include the conveyance of the object/information being indicated, the conveyance of an identifier of the object/ information being indicated, the conveyance of information used to generate the object/information being indicated, the conveyance of some part or portion of the object/information being indicated, the conveyance of some derivation of the object/information being indicated, and the conveyance of some symbol representing the object/information being indicated.

According to example embodiments, network apparatuses, elements or entities including cloud-based data centers, computers, cloud-based servers, or the like, may be (or include) hardware, firmware, hardware executing software or any combination thereof. Such hardware may include processing or control circuitry such as, but not limited to, one or more processors, one or more CPUs, one or more controllers, one or more ALUs, one or more DSPs, one or more microcomputers, one or more FPGAs, one or more SoCs, one or more PLUs, one or more microprocessors, one or more ASICs, or any other device or devices capable of responding to and executing instructions in a defined manner.

Benefits, other advantages, and solutions to problems have been described above with regard to specific embodiments of the invention. However, the benefits, advantages, solutions to problems, and any element(s) that may cause or result in such benefits, advantages, or solutions, or cause such benefits, advantages, or solutions to become more pronounced are not to be construed as a critical, required, or essential feature or element of any or all the claims.

Reference is made in detail to embodiments, examples of which are illustrated in the accompanying drawings, wherein like reference numerals refer to the like elements throughout. In this regard, the example embodiments may have different forms and should not be construed as being limited to the descriptions set forth herein. Accordingly, the example embodiments are merely described below, by referring to the figures, to explain example embodiments of the present description. Aspects of various embodiments are specified in the claims.

What is claimed is:

1. A method for allocating resources of a field-programmable gate array (FPGA), the method comprising:
    deterministically estimating a maximum latency for executing a network service at the FPGA based on a worst-case time of the FPGA, the worst-case time of the FPGA being an estimated worst-case latency for serving the network service based on a scheduling algorithm applied to a slot in the FPGA;
    determining that the maximum latency is less than a threshold latency value associated with the network service;
    outputting an acknowledgement indicating that the maximum latency is less than or equal to the threshold latency value;
    receiving confirmation that the FPGA has been selected to execute the network service within a threshold time period; and
    deterministically scheduling the resources of the FPGA for executing the network service in response to receiving the confirmation within the threshold time period, wherein
        the slot in the FPGA is a smallest slot among a plurality of slots in the FPGA, the slot including resources including memory and configurable logic blocks.

2. The method of claim 1, further comprising:
    outputting a result of the deterministically scheduling in a deterministic time, the result indicating completion of the deterministically scheduling.

3. The method of claim 1, wherein the deterministically scheduling the resources comprises:
    mapping the network service to the slot of the FPGA including the resources;
    selecting an implementation of the scheduling algorithm for configuring the resources to execute one or more requested functions of the network service; and
    scheduling the FPGA resources according to the implementation of the scheduling algorithm.

4. The method of claim 3, wherein the selecting selects the implementation of the scheduling algorithm from a look up table.

5. The method of claim 3, wherein the selecting selects the implementation of the scheduling algorithm based on a dependency graph representation of the network service, a deadline for the network service to be executed, and a time window for which the resources are allowed to execute.

6. The method of claim 1, further comprising:
    determining that the maximum latency is greater than the threshold latency value associated with the network service; and
    outputting a negative acknowledgement indicating that the maximum latency is greater than the threshold latency value.

7. The method of claim 1, further comprising:
    estimating the worst case time using a first-fit instance of a bin packing algorithm applied to the slot in the FPGA.

8. A network apparatus for allocating resources of a field-programmable gate array (FPGA), the network apparatus comprising:
    at least one processor; and
    at least one memory including computer program code, the at least one memory and the computer program code configured to, with the at least one processor, cause the network apparatus to
        deterministically estimate a maximum latency for executing a network service at the FPGA based on a worst-case time of the FPGA, the worst-case time of the FPGA being an estimated worst-case latency for serving the network service based on a scheduling algorithm applied to a slot in the FPGA,
        determine that the maximum latency is less than a threshold latency value associated with the network service,
        output an acknowledgement indicating that the maximum latency is less than or equal to the threshold latency value,
        receive confirmation that the FPGA has been selected to execute the network service within a threshold time period, and
        deterministically schedule the resources of the FPGA for executing the network service in response to receiving the confirmation within the threshold time period, wherein
            the slot in the FPGA is a smallest slot among a plurality of slots in the FPGA, the slot including resources including memory and configurable logic blocks.

9. The network apparatus of claim 8, wherein the at least one memory and the computer program code are configured to, with the at least one processor, cause the network apparatus to output a result of the deterministically scheduling in a deterministic time, the result indicating completion of the deterministically scheduling.

10. The network apparatus of claim 8, wherein the at least one memory and the computer program code are configured to, with the at least one processor, cause the network apparatus to deterministically schedule the resources of the FPGA by
    mapping the network service to the slot of the FPGA including the resources,
    selecting an implementation of the scheduling algorithm for configuring the resources to execute one or more requested functions of the network service, and
    scheduling the FPGA resources according to the implementation of the scheduling algorithm.

11. The network apparatus of claim 10, wherein the at least one memory and the computer program code are configured to, with the at least one processor, cause the network apparatus to select the implementation of the scheduling algorithm from a look up table.

12. The network apparatus of claim 10, wherein the at least one memory and the computer program code are configured to, with the at least one processor, cause the network apparatus to select the implementation of the scheduling algorithm based on a dependency graph representation of the network service, a deadline for the network service to be executed, and a time window for which the resources are allowed to execute.

13. The network apparatus of claim 8, wherein the at least one memory and the computer program code are configured to, with the at least one processor, cause the network apparatus to
    determine that the maximum latency is greater than the threshold latency value associated with the network service, and
    output a negative acknowledgement indicating that the maximum latency is greater than the threshold latency value.

14. A non-transitory computer-readable storage medium storing computer-readable instructions that, when executed by at least one processor at a network apparatus, cause the network apparatus to perform a method for allocating resources of a field-programmable gate array (FPGA), the method comprising:
    deterministically estimating a maximum latency for executing a network service at the FPGA based on a worst-case time of the FPGA, the worst-case time of the FPGA being an estimated worst-case latency for serving the network service based on a scheduling algorithm applied to a slot in the FPGA;
    determining that the maximum latency is less than a threshold latency value associated with the network service;
    outputting an acknowledgement indicating that the maximum latency is less than or equal to the threshold latency value;
    receiving confirmation that the FPGA has been selected to execute the network service within a threshold time period; and
    deterministically scheduling the resources of the FPGA for executing the network service in response to receiving the confirmation within the threshold time period, wherein
        the slot in the FPGA is a smallest slot among a plurality of slots in the FPGA, the slot including resources including memory and configurable logic blocks.

15. The non-transitory computer-readable storage medium of claim 14, wherein the method further comprises:
    outputting a result of the deterministically scheduling in a deterministic time, the result indicating completion of the deterministically scheduling.

16. The non-transitory computer-readable storage medium of claim 14, wherein the deterministically scheduling the resources comprises:
    mapping the network service to the slot of the FPGA including the resources;
    selecting an implementation of the scheduling algorithm for configuring the resources to execute one or more requested functions of the network service; and
    scheduling the FPGA resources according to the implementation of the scheduling algorithm.

17. The non-transitory computer-readable storage medium of claim 16, wherein the selecting selects the implementation of the scheduling algorithm from a look up table.

18. The non-transitory computer-readable storage medium of claim 16, wherein the selecting selects the implementation of the scheduling algorithm based on a dependency graph representation of the network service, a deadline for the network service to be executed, and a time window for which the resources are allowed to execute.

19. The non-transitory computer-readable storage medium of claim 14, wherein the method further comprises:
    determining that the maximum latency is greater than the threshold latency value associated with the network service; and
    outputting a negative acknowledgement indicating that the maximum latency is greater than the threshold latency value.

* * * * *